US010453928B2

(12) United States Patent
Kjar

(10) Patent No.: US 10,453,928 B2
(45) Date of Patent: Oct. 22, 2019

(54) RADIO FREQUENCY ISOLATION FOR SOI TRANSISTORS

(71) Applicant: Skyworks Solutions, Inc., Woburn, MA (US)

(72) Inventor: Raymond A. Kjar, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/373,263

(22) Filed: Dec. 8, 2016

(65) Prior Publication Data

US 2017/0154964 A1    Jun. 1, 2017

Related U.S. Application Data

(60) Continuation of application No. 14/053,114, filed on Oct. 14, 2013, now Pat. No. 9,548,351, which is a
(Continued)

(51) Int. Cl.
*H01L 29/40* (2006.01)
*H01L 21/762* (2006.01)
(Continued)

(52) U.S. Cl.
CPC .......... *H01L 29/402* (2013.01); *H01L 21/765* (2013.01); *H01L 21/76264* (2013.01);
(Continued)

(58) Field of Classification Search
CPC .............. H01L 27/1203; H01L 21/84; H01L 29/66772; H01L 29/78606;
(Continued)

(56) References Cited

U.S. PATENT DOCUMENTS 6,130,458 A * 10/2000 Takagi .................. H01L 21/743
257/341
6,355,537 B1    3/2002 Seefeldt
(Continued)

FOREIGN PATENT DOCUMENTS

KR      10-0372072      1/2003

OTHER PUBLICATIONS

Frost, voltage-What is ground and what does it do?, Electrical Engineering Stack Exchange.*
(Continued)

*Primary Examiner* — David Chen
(74) *Attorney, Agent, or Firm* — Knobbe, Martens, Olson & Bear LLP

(57) ABSTRACT

According to one example embodiment, a structure includes at least one SOI (semiconductor-on-insulator) transistor situated over a buried oxide layer, where the buried oxide layer overlies a bulk substrate. The structure further includes an electrically charged field control ring situated over the buried oxide layer and surrounding the at least one SOI transistor. A width of the electrically charged field control ring is greater than a thickness of the buried oxide layer. The electrically charged field control ring reduces a conductivity of a surface portion of the bulk substrate underlying the field control ring, thereby reducing RF coupling of the at least one SOI transistor through the bulk substrate. The structure further includes an isolation region situated between the electrically charged field control ring and the at least one SOI transistor. A method to achieve and implement the disclosed structure is also provided.

18 Claims, 4 Drawing Sheets

Related U.S. Application Data division of application No. 12/009,071, filed on Jan. 16, 2008, now abandoned.

(60) Provisional application No. 60/906,426, filed on Mar. 11, 2007.

(51) Int. Cl.
  *H01L 29/739* (2006.01)
  *H01L 21/765* (2006.01)
  *H01L 27/12* (2006.01)
  *H01L 29/66* (2006.01)
  *H01L 29/786* (2006.01)
  *H01L 29/06* (2006.01)
  *H01L 23/66* (2006.01)

(52) U.S. Cl.
  CPC .......... *H01L 23/66* (2013.01); *H01L 27/1203* (2013.01); *H01L 29/0619* (2013.01); *H01L 29/401* (2013.01); *H01L 29/407* (2013.01); *H01L 29/66772* (2013.01); *H01L 29/7394* (2013.01); *H01L 29/78606* (2013.01); *H01L 29/78609* (2013.01)

(58) Field of Classification Search
  CPC ............. H01L 21/76264; H01L 21/765; H01L 29/7394; H01L 29/7824; H01L 29/78609
  USPC .......................... 257/347, E21.703, E27.112
  See application file for complete search history.

(56) References Cited

U.S. PATENT DOCUMENTS

| | | | |
|---|---|---|---|
| 6,459,134 | B2 | 10/2002 | Ohguro et al. |
| 6,465,830 | B2 | 10/2002 | Babcock et al. |
| 6,531,738 | B1 | 3/2003 | Uemoto |
| 6,545,318 | B1* | 4/2003 | Kunikiyo ............... H01L 21/84 257/347 |
| 6,562,666 | B1 | 5/2003 | Park |
| 6,566,713 | B2 | 5/2003 | Nii |
| 6,909,114 | B1 | 6/2005 | Yamazaki |
| 7,109,072 | B2 | 9/2006 | Saito et al. |
| 2002/0160562 | A1 | 10/2002 | Babcock |
| 2003/0025135 | A1* | 2/2003 | Matsumoto ....... H01L 29/66636 257/288 |
| 2005/0282375 | A1* | 12/2005 | Nitta ..................... H01L 21/761 438/620 |
| 2006/0148162 | A1 | 7/2006 | Umebayashi |
| 2006/0197127 | A1* | 9/2006 | Yamamoto ........... H01L 21/761 257/292 |
| 2006/0214304 | A1* | 9/2006 | Lan .................... G11C 13/0009 257/762 |

OTHER PUBLICATIONS

Li Z et al, "15-GHz fully integrated nMOS switches in a 0.13-µm CMOS process," IEEE Journal of Solid-State Circuits, vol. 40, No. 11, pp. 2323-2328, published Nov. 1, 2005.

Raskin J-P et al, "Substrate Crosstalk Reduction Using SOI Technology," IEEE Transactions on Electron Devices, vol. 44, No. 12, pp. 2252-2261, published Dec. 1, 1997.

Zhang Guoyan et al, "The simulation analysis of cross-talk behavior in SOI mixed-mode integrated circuits," 6th International Conference on Solid-State and Integrated-Circuit Technology, vol. 2, pp. 916-919, dated Oct. 22, 2001.

International Search Report and Written Opinion of the International Search Authority in PCT/US2008/002632, 6 pages, dated Jun. 25, 2008.

Supplemental European Search Report, issued in application No. EP 08 72 6209, 1 page, dated Nov. 16, 2011.

* cited by examiner

RADIO FREQUENCY ISOLATION FOR SOI TRANSISTORS

RELATED APPLICATIONS

The present application is a continuation of U.S. application Ser. No. 14/053,114, filed on Oct. 14, 2013, which is a division of U.S. application Ser. No. 12/009,071, filed on Jan. 16, 2008, which claims the benefit of and priority to provisional patent application entitled "Electrical Isolation Control in SOI Transistors and Switches," Ser. No. 60/906,426, filed on Mar. 11, 2007. Each of the foregoing applications is hereby incorporated herein by reference in its entirety.

BACKGROUND

Field

The present invention generally relates to the field of semiconductors. More particularly, the invention relates to semiconductor-on-insulator (SOI) devices.

Background Art

Transistors fabricated on a semiconductor-on-insulator (SOI) substrate (hereinafter referred to as "SOI transistors"), such as N-channel Metal Oxide Semiconductor (NMOS) and P-channel MOS (PMOS) SOI transistors, can be utilized in RF switches in electronic devices, such as cellular phones. For example, multiple SOI transistors can be coupled in series to provide an RF switch capable of handling the power levels required in a cellular phone. However, capacitive coupling between source/drain regions of the SOI transistor and an underlying bulk silicon substrate can adversely affect SOI transistor performance by, for example, providing an RF signal path to ground.

In one conventional approach, capacitive coupling in SOI substrates can be reduced by increasing the thickness of an underlying buried oxide layer, which is situated between the top silicon layer and the bulk silicon substrate. However, increasing the thickness of the buried oxide layer oxide beyond approximately 1.0 micron can increase strain in the SOI substrate, which can cause undesirably warping in the wafer. In another conventional approach, a high resistivity sapphire substrate can be used in place of the bulk silicon substrate. Although the sapphire substrate is effective in reducing capacitive coupling, the sapphire substrate significantly increases manufacturing cost.

Another conventional approach for reducing capacitive coupling in SOI substrates utilizes a high-resistivity bulk silicon substrate, such as a bulk silicon substrate having a resistivity of up to 1000 Ohms-cm. However, various effects, such as trapped charge in the buried oxide layer or at the interface between the buried oxide layer and the bulk substrate can induce a surface charge on the bulk substrate. As a result, a surface conducting layer can form on the bulk substrate, which can undesirably reduce the overall resistivity of the bulk substrate and, thereby increase capacitive coupling in the SOI substrate. The surface conducting layer can also provide an undesirable RF signal path between adjacent SOI transistors.

SUMMARY

Radio frequency isolation for semiconductor-on-insulator (SOI) transistors, substantially as shown in and/or described in connection with at least one of the figures, as set forth more completely in the claims.

DETAILED DESCRIPTION

The present invention is directed to electrical isolation for SOI (semiconductor-on-insulator) transistors. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
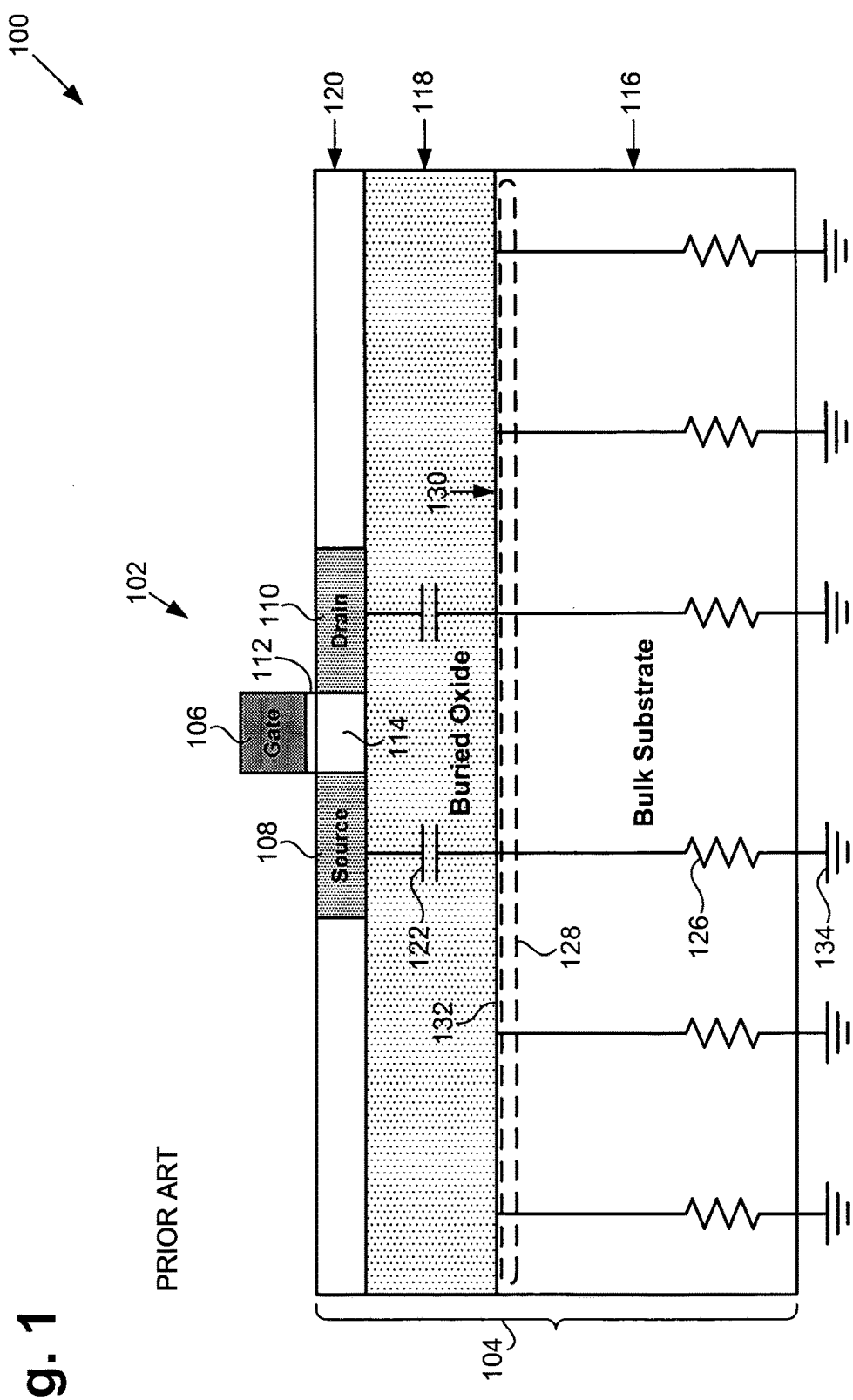
FIG. 1 shows a cross-sectional view of an exemplary SOI transistor in an SOI substrate.

FIG. 1 shows a cross-sectional view of conventional structure 100 including an exemplary SOI (semiconductor-on-insulator) transistor situated on an SOI substrate. The SOI substrate can be, for example, a silicon-on-insulator substrate. Conventional structure 100, which can be a portion of a semiconductor die, includes SOI transistor 102 and SOI substrate 104. SOI transistor 102 can be utilized in, for example, an RF switch in an electronic device, such as a cellular phone. SOI transistor 102 includes gate 106, source 108, drain 110, gate dielectric layer 112, and channel region 114 and can be, for example, an NMOS or a PMOS SOI transistor. SOI substrate 104 includes bulk substrate 116, buried oxide layer 118, and silicon layer 120. In a typical application, unused portions of the silicon layer are removed by etching such that each SOI transistor can be electrically isolated from other circuit elements.

As shown in FIG. 1, buried oxide layer 118 is situated over bulk substrate 116, which can be a bulk silicon substrate having a high resistivity. For example, bulk substrate 116 can have a resistivity of approximately 1000.0 Ohm-centimeters (cm). Bulk substrate 116 can be an N type or a P type substrate, i.e., a substrate having a respective N type or P type conductivity. Buried oxide layer 118 can comprise silicon oxide and can have a thickness of, for example, between 0.4 and 1.0 micron. Also shown in FIG. 1, source 108, drain 110, and channel region 114 of SOI transistor 102 are situated in silicon layer 120, which overlies buried oxide layer 118. Source 108 and drain 110, which are situated on opposite sides of channel region 114, can be heavily doped with a suitable dopant. Further shown in FIG. 1, gate dielectric layer 112, which can comprise silicon oxide or other suitable gate dielectric material, is situated over channel region 114 and gate 106 is situated over gate dielectric layer 112. Gate 106 can comprise a suitable conductive material, such as polycrystalline silicon (polysilicon).

Also shown in FIG. 1, buried oxide layer 118 has a capacitance, which is indicated by capacitors 122. Further shown in FIG. 1, the interior portion of bulk substrate 116 has a high resistance (represented by resistors 126), which can be achieved by lightly doping the bulk substrate with a suitable dopant, such as an N type or P type dopant. However, as a result of several factors, conductive surface layer 128, which has a low resistance, can form in bulk substrate 116 at interface 130, i.e., the interface buried oxide layer 118 and the bulk substrate. For example, trapped charge in buried oxide layer 118 or at interface 130 can induce an opposite charge at top surface 132 of bulk substrate 116, which can form conductive surface layer 128. Also, conductive surface layer 128 can be formed as a result of surface charge that is induced on bulk substrate 116 as a result of a work function difference between bulk substrate 116 and silicon layer 120 or by a voltage that is applied to source 108 or drain 110 of SOI transistor 102. Conductive surface layer 128 can extend into bulk substrate 116 from top surface 132 to a depth of a few microns.

The interior portion of bulk substrate 116, which has a high resistance, is in series with the capacitance of buried oxide layer 118, which increases the resistance of the conductive path between source 108 or drain 110 of SOI transistor 102 and ground 134. However, conductive surface layer 128, which has a low resistance and is situated in parallel with the interior portion of bulk substrate 116, can significantly reduce the overall resistance of bulk substrate 116. As a result, the resistance of the RF signal path between SOI transistor 102 and ground 134 is significantly reduced, thereby undesirably affecting the RF performance of SOI transistor 102. Also, an RF signal from SOI transistor 102 can be undesirably coupled to another SOI transistor by utilizing conductive surface layer 128 as a common node. Thus, conductive surface layer 128 can significantly reduce or negate the advantage of utilizing a high resistance bulk substrate to reduce RF coupling to ground in an SOI substrate.

Figure 2:
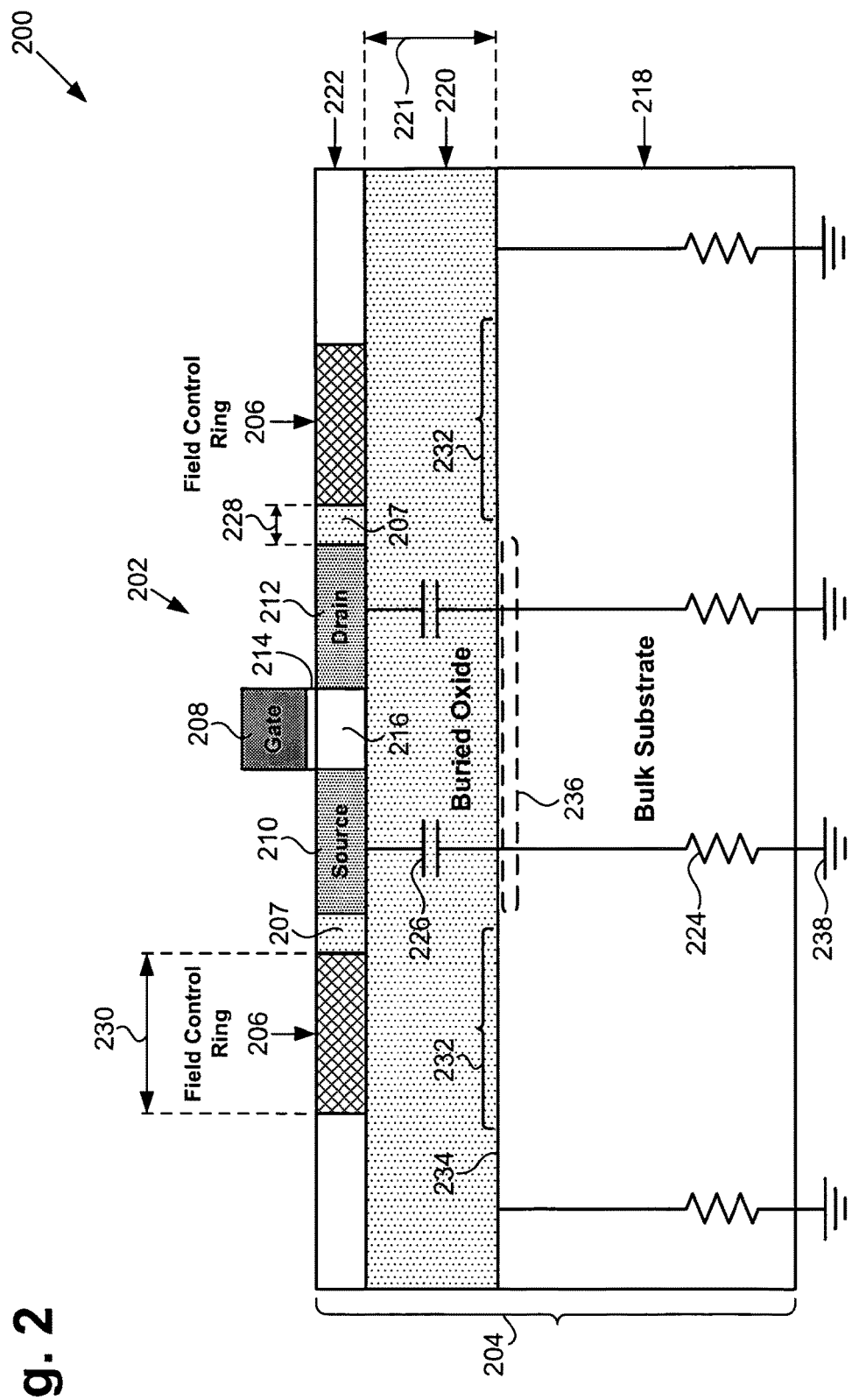
FIG. 2 shows a cross-sectional view of an exemplary SOI transistor surrounded by an exemplary field control ring in an SOI substrate, in accordance with one embodiment of the present invention.

FIG. 2 shows a cross-sectional view of structure 200 including SOI (semiconductor-on-insulator) transistor 202 and field control ring 206 in accordance with one embodiment of the present invention. Certain details and features have been left out of FIG. 2 that are apparent to a person of ordinary skill in the art. Structure 200, which can be a portion of a semiconductor die, includes SOI transistor 202, SOI substrate 204, field control ring 206, which is also referred to as an "electrically charged field control ring" in the present application, and isolation region 207. SOI substrate 204 can be, for example, a silicon-on-insulator substrate. SOI transistor 202 and field control ring 206 can be utilized, for example, in an RF switch in an electronic device, such as a cellular phone. However, SOI transistor 202 and field control ring 206 can also be utilized in other types of circuit applications in electronic devices. SOI transistor 202 includes gate 208, source 210, drain 212, gate dielectric layer 214, and channel region 216 and can be NMOS SOI transistor. In one embodiment, SOI transistor 202 can be a PMOS SOI transistor. In another embodiment, SOI transistor 202 can be a lateral or vertical bipolar transistor. SOI substrate 204 includes bulk substrate 218, buried oxide layer 220, and silicon layer 222.

As shown in FIG. 2, buried oxide layer 220 is situated over bulk substrate 218, which can be a bulk silicon substrate and can have a high resistivity. For example, the interior portion of bulk substrate 218 can have a resistivity (indicated by resistors 224) greater than approximately 1000.0 Ohm-cm. In one embodiment, the interior portion of bulk substrate 218 can have a resistivity of approximately 1000.0 Ohm-cm. In the present embodiment, bulk substrate 218 can be a P type silicon substrate. In one embodiment, bulk substrate 218 can be an N type silicon substrate. Buried oxide layer 220 can comprise silicon oxide and has thickness 221, which can be, for example, between approximately 0.4 micron and approximately 1.0 micron. Buried oxide layer 220 also has a capacitance, which is indicated by capacitors 226.

Also shown in FIG. 2, source 210, drain 212, and channel region 216 of SOI transistor 202 are situated in silicon layer 222, which overlies buried oxide layer 220. Source 210 and drain 212 are situated on opposite sides of channel region 216 and can comprise a suitable N type dopant. In an embodiment in which SOI transistor 202 is a PMOS SOI transistor, source 210 and drain 212 can comprise a suitable P type dopant. Source 210 and drain 212 can be formed, for example, by heavily doping segments of silicon layer 222 with a suitable N type dopant. Further shown in FIG. 2, gate dielectric layer 214 is situated over channel region 216 and gate 208 is situated over gate dielectric layer 214. Gate dielectric layer 214 can comprise silicon oxide or other suitable dielectric material and gate 208 can comprise a conductive material, such as metal or polysilicon. Gate 208 can be formed by, for example, depositing and patterning a suitable conductive material, such as polysilicon, over silicon layer 222.

Further shown in FIG. 2, isolation region 207 is situated over buried oxide layer 220 and surrounds SOI transistor 202. Isolation region 207 can comprise silicon oxide or other suitable dielectric material and can be, for example, a shallow trench isolation (STI) region. Isolation region 207 can be formed in SOI substrate 204 by forming a trench in silicon layer 222 and filling the trench with, for example, silicon oxide. Isolation region 207, which electrically isolates SOI transistor 202 from field control ring 206, has width 228, which can be, for example, between approximately 2.0 microns and approximately 10.0 microns.

Also shown in FIG. 2, field control ring 206 is situated over buried oxide layer 220 and surrounds isolation region 207 and SOI transistor 202. Field control ring 206 can comprise silicon or other suitable conductive material. In one embodiment, field control ring 206 can comprise polysilicon. In another embodiment, field control ring 206 can comprise a metal. In another embodiment, there may be an insulating layer between the field control ring and the buried oxide. Field control ring 206 has width 230, which is greater than thickness 221 of buried oxide layer 220. For example, width 230 can be greater than thickness 221 of buried oxide layer 220 by a factor of between approximately 3.0 and approximately 10.0. Thus, for example, width 230 of field control ring 206 can be between approximately 1.2 microns and approximately 10.0 microns. In the present embodiment, field control ring 206 can be formed by appropriately patterning silicon layer 222. In other embodiments, field control ring 206 can be formed by patterning a suitable conductive material, such as polysilicon or metal, in which case there may be an added dielectric layer between the filed control ring and the buried oxide layer. Such dielectric layer would not affect the function of the field control ring. Although not shown in FIG. 2, an isolation region can surround field control ring 206.

In the present invention, an electrical charge can be created and/or applied to field control ring 206 so as to control a surface conductivity in surface portion 232 of bulk substrate 218, which underlies field control ring 206. The electrical charge can be created and/or applied to field control ring 206 by, for example, doping field control ring 206 with an appropriate concentration of dopant having a desired conductivity type and/or by applying an external bias voltage to field control ring 206. An amount of electrical charge having a suitable conductivity type, e.g., P type or N type, can be applied to field control ring 206 to induce a sufficient charge on surface portion 232 of bulk substrate 218 so as to significantly reduce surface conductivity in surface portion 232. By significantly reducing surface conduction in surface portion 232, the invention correspondingly increases the resistance of surface portion 232. The conductivity type of the electrical charge applied to field control ring 206 can correspond to the conductivity type of bulk substrate 218. In the present embodiment, the electrical charge applied to field control ring 206 can have a P type to correspond to the P type conductivity of bulk substrate 218. In an embodiment in which bulk substrate 218 has N type conductivity, an N type electrical charge can be applied to field control ring 206.

As discussed above, a conductive surface layer, such as conductive surface layer 128 in structure 100 in FIG. 1, can form in top surface 234 at the interface between buried oxide layer 220 and bulk substrate 218 as a result of, for example, trapped charge in buried oxide layer 220 and/or a source or drain voltage applied to SOI transistor 202. The conductive surface layer, which has a low resistance, can reduce the overall resistivity of bulk substrate 218, which is in series with the capacitance of buried oxide layer 220. As a result, the resistance of the RF path through buried oxide layer 220 and bulk substrate 218 to ground 238 can decrease, thereby undesirably affecting the RF performance of SOI transistor 202. However, in the invention, the electrical charge on field control ring 206 can control surface conductivity in surface portion 232 of bulk substrate 218, which surrounds the surface portion of bulk substrate 218 underlying SOI transistor 202. As a result of the present invention's field control ring, conductive surface layer 236 is limited to the portion of bulk substrate 218 underlying SOI transistor 202.

By limiting conductive surface layer 236 to the portion of bulk substrate 218 underlying SOI transistor 202, the overall resistivity of bulk substrate 218 is significantly increased, since the limited, low resistance conductive surface layer of bulk substrate 218 is in series with the high-resistivity internal portion of the bulk substrate. Since the capacitance of buried oxide layer 220 is in series with bulk substrate 218, which has an overall high resistivity as a result of invention's field control ring, RF coupling between source 210 or drain 212 and ground 238 is significantly reduced. Also, by limiting conductive surface layer 236 to the portion of bulk substrate 218 underlying SOI transistor 202, field control ring 206 prevents an RF signal from SOI transistor 202 from utilizing the conductive surface layer to travel to an SOI transistor situated outside of field control ring 206. Thus, field control ring 206 can minimize RF coupling of SOI transistor 202 through the bulk substrate by electrically isolating a conductive surface layer in the bulk substrate underlying the SOI transistor.

In one embodiment, field control ring 206 can comprise a conductive material having a high resistance, such as high resistance P type polysilicon. For example, the resistance of the conductive material can be increased by lightly doping it with, for example, a P type dopant. By utilizing a conductive material with a high resistance to form field control ring 206, the resistance of the RF path formed by field control ring 206 can be increased. As a result, the effect of RF coupling between SOI transistor 202 and field control ring 206 can be minimized. The high resistance conductive material can have a sufficient electrical charge so as to control the surface conductivity of the portion of bulk substrate 218 underlying the field control ring, as discussed above.

Figure 3:
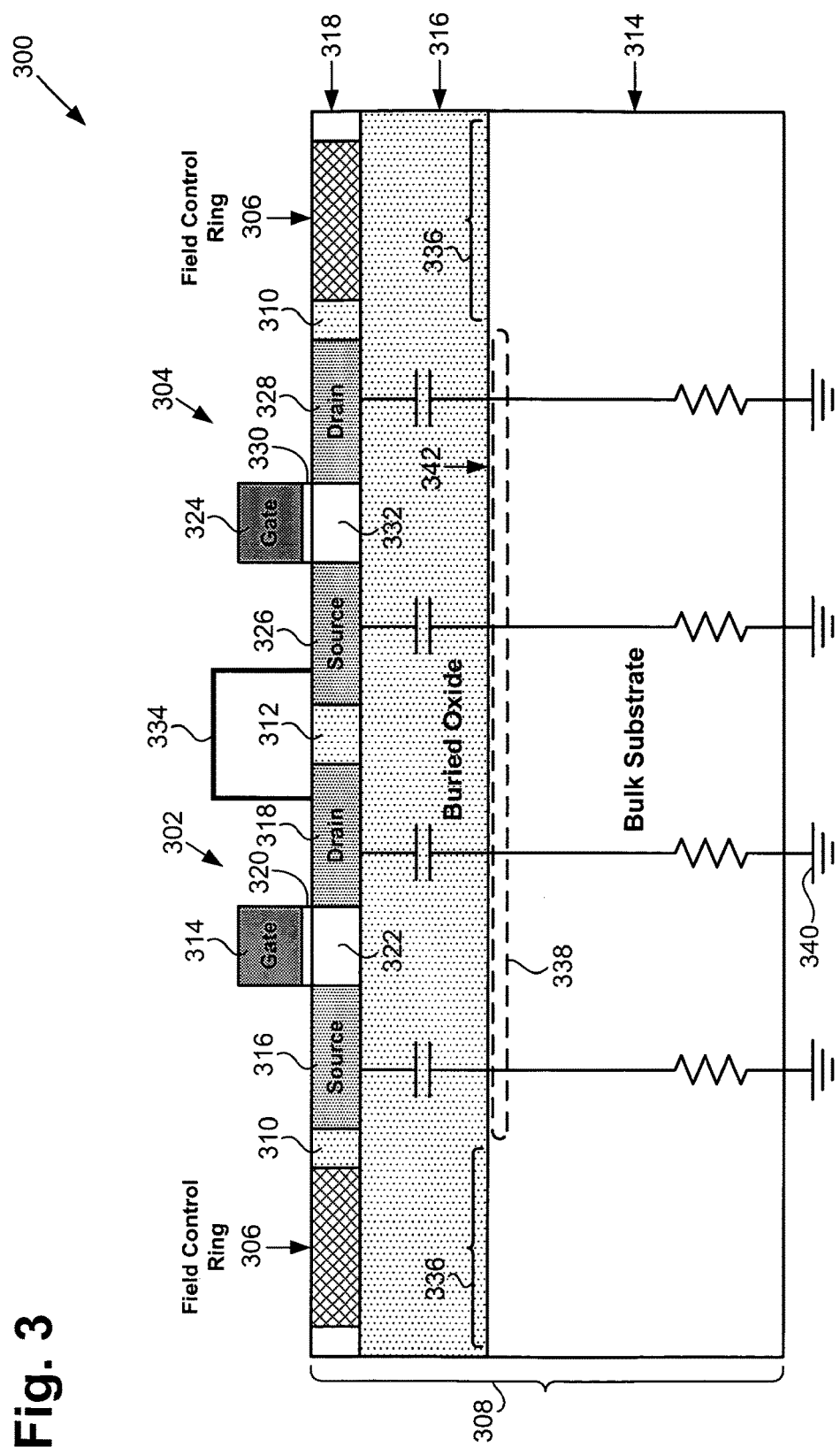
FIG. 3 shows a cross-sectional view of two exemplary SOI transistors surrounded by an exemplary field control ring in an SOI substrate, in accordance with one embodiment of the present invention.

FIG. 3 shows a cross-sectional view of structure 300 including series-coupled SOI transistors 302 and 304 and field control ring 306, in accordance with one embodiment of the present invention. Certain details and features have been left out of FIG. 3 that are apparent to a person of ordinary skill in the art. Structure 300, which can be a portion of a semiconductor die, includes SOI transistors 302 and 304, field control ring 306, which is also referred to as an "electrically charged field control ring" in the present application, SOI substrate 308, and isolation regions 310 and 312. SOI transistor 302 includes gate 314, source 316, drain 318, gate dielectric layer 320, and channel region 322, SOI transistor 304 includes gate 324, source 326, drain 328, gate dielectric layer 330, and channel region 332, and SOI substrate 308 includes bulk substrate 314, buried oxide layer 316, and silicon layer 318. In FIG. 3, SOI transistors 302 and 304 are each substantially similar in composition and formation to SOI transistor 202 in FIG. 2. In FIG. 3, bulk substrate 324, buried oxide layer 316, and silicon layer 318 in SOI substrate 308 correspond, respectively, to bulk substrate 218, buried oxide layer 220, and silicon layer 222 in SOI substrate 204 in FIG. 2.

In structure 300, SOI transistors 302 and 304 are coupled in series and are surrounded by field control ring 306. SOI transistors 302 and 304 can form, for example, an RF switch, which can be utilized in a cellular phone or other electronic device. Although only two series-coupled SOI transistors are shown in FIG. 3 to preserve brevity, an embodiment of the invention can include up to six or more series-coupled SOI transistors, which are surrounded by a field control ring, such as field control ring 306. However, SOI transistors 302 and 304 can also be utilized in an electronic circuit other than an RF switch. In the present embodiment, SOI transistors 302 and 304 can each be an NMOS SOI transistor. In one embodiment, SOI transistors 302 and 304 can each be a PMOS SOI transistor. In another embodiment, SOI transistors 302 and 304 can each be a lateral or vertical bipolar transistor.

As shown in FIG. 3, buried oxide layer 316 is situated over bulk substrate 314 and silicon layer 318, which is the top silicon layer in SOI substrate 308, is situated over buried oxide layer 316. Also shown in FIG. 3, source 316, drain 318, and channel region 322 of SOI transistor 302 and source 326, drain 328, and channel region 332 of SOI transistor 304 are situated over buried oxide layer 316 and formed in silicon layer 318. Further shown in FIG. 3, isolation region 312 is situated between SOI transistors 302 and 304 and situated over buried oxide layer 316 and isolation region 310 surrounds SOI transistors 302 and 304 and is situated over buried oxide layer 316. Isolation regions 310 and 312 can comprise silicon oxide and can be, for example, STI regions. Isolation region 310 can have a width of between approximately 2.0 microns and approximately 10.0 microns.

Also shown in FIG. 3, gate dielectric layers 320 and 330 are situated over channel regions 322 and 332 and gates 314 and 324 are situated over gate dielectric layers 320 and 330, respectively. Further shown in FIG. 3, source 326 of SOI transistor 304 is electrically coupled to drain 318 of SOI transistor 302 by conductive path 334. Conductive path 334 can be formed by, for example, merging the transistor structures or, for example, conductive vias formed in an overlying dielectric layer and a metal segment situated in an overlying metal, which are not shown in FIG. 3. Also shown in FIG. 3, field control ring 306 is situated over buried oxide layer 316 and surrounds SOI transistors 302 and 304. Field control ring 306 is substantially similar in composition, width, and formation as field control ring 206 in structure 200 in FIG. 2. An isolation region (not shown in FIG. 3) can surround field control ring 306.

Similar to field control ring 206 as discussed above, an electrical charge can be applied to field control ring 306 so as to control surface conductivity in surface portion 336 of bulk substrate 314 underlying bulk substrate 314. By appropriately controlling the amount and the conductivity type of the electrical charge applied to field control ring 206, surface conductivity in surface portion 336 of bulk substrate 314 can be significantly reduced, thereby correspondingly increasing the resistance of surface portion 336. By sufficiently reducing the surface conductivity of surface portion 336, field control ring 306 can limit conductive surface layer 338 to the portion of bulk substrate 314 underlying SOI transistors 302 and 304. Conductive surface layer 338 is substantially similar in composition and formation to conductive surface layer 128 in FIG. 1 and conductive surface layer 236 in FIG. 2.

By limiting conductive surface layer 338 to the portion of bulk substrate 314 underlying SOI transistors 302 and 304, the embodiment of the invention's field control ring 306 can significantly increase the overall resistance of bulk substrate 314, thereby reducing RF coupling between SOI transistors 302 and 304 and ground 340. The embodiment of the invention's field control ring 306 can also prevent an RF signal from SOI transistors 302 and 304 from utilizing conductive surface layer 338 as a conductive path to couple to an SOI transistor outside of field control ring 306. Thus, field control ring 306 can minimize RF coupling of SOI transistors 302 and 304 through the bulk substrate by electrically isolating a conductive surface layer in the bulk substrate underlying the SOI transistors. The embodiment of the invention's field control ring 306 provides similar advantages as discussed above in relation to the embodiment of the invention's field control ring 206 in FIG. 2.

Figure 4:
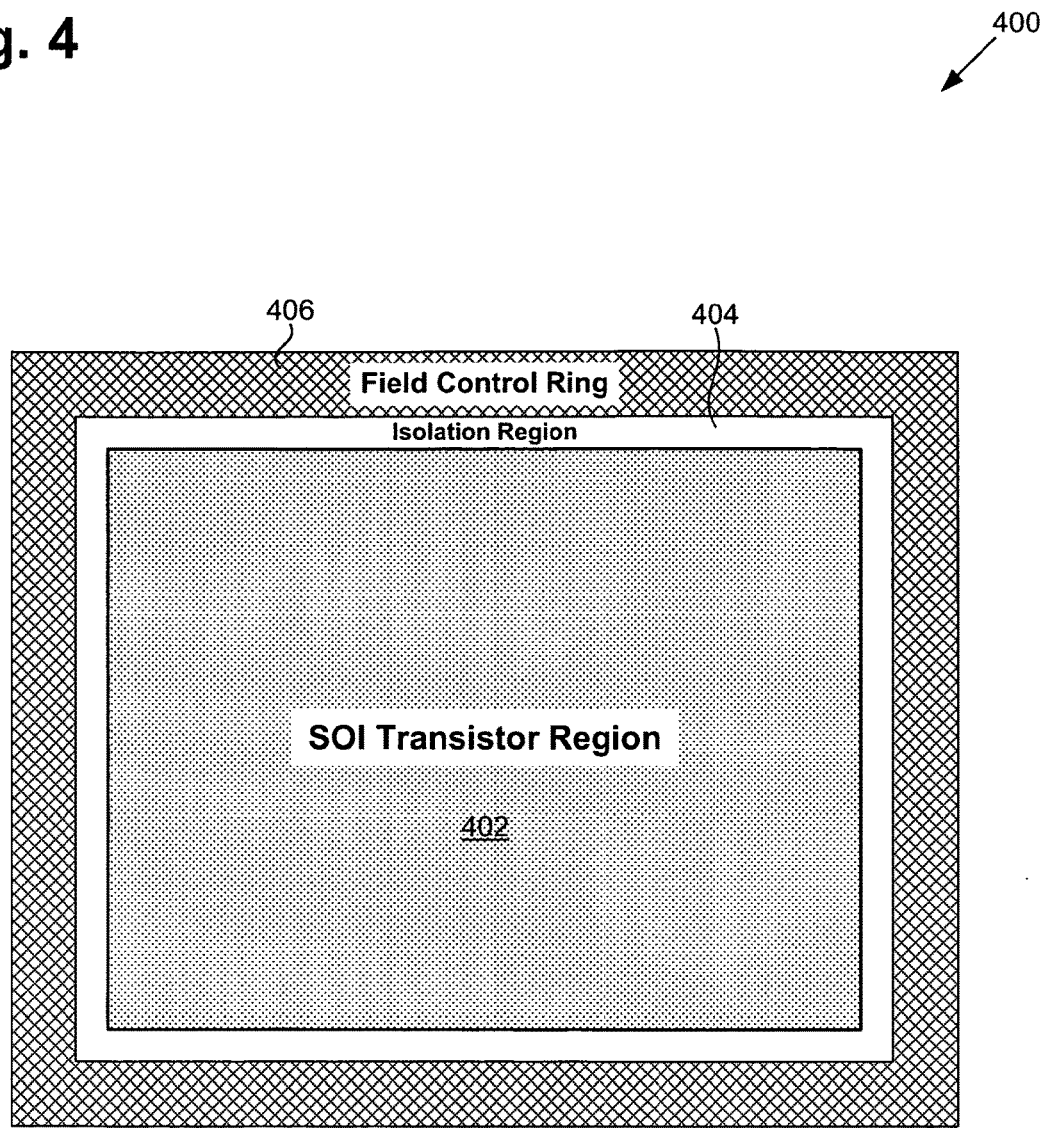
FIG. 4 shows a top view of an exemplary SOI transistor region surrounded by an exemplary field control ring, in accordance with one embodiment of the present invention.

FIG. 4 shows a top view of structure 400 including SOI transistor region 402 and field control ring 406 in accordance with one embodiment of the present invention. Structure 400, which can be a portion of a semiconductor die, includes SOI transistor region 402, isolation region 404, and field control ring 406. Structure also includes an SOI substrate (not shown in FIG. 4), such as SOI substrate 204 in FIG. 2 or SOI substrate 308 in FIG. 3. SOI transistor region 402 can include one or more SOI transistors (not shown in FIG. 4), such as SOI transistor 202 in FIG. 2 or SOI transistors 302 and 304 in FIG. 3. In one embodiment, SOI transistor region 402 can include two or more SOI transistors, such as SOI transistors 302 and 304, which can be coupled in series to form an RF switch. In another embodiment, SOI transistor region 402 can include two or more SOI transistors that can be utilized in a circuit other than an RF switch.

As shown in FIG. 4, isolation region 404 surrounds SOI transistor region 402 and is situated over a buried oxide layer (not shown in FIG. 4), such as buried oxide layer 220 in FIG. 2 or buried oxide layer 316 in FIG. 3. Isolation region 404 can be an STI region and is substantially similar in composition and width as isolation region 207 in FIG. 2 or isolation region 310 in FIG. 3. Also shown in FIG. 4, field control ring 406 is situated over the buried oxide layer (not shown in FIG. 4) and surrounds isolation region 404 and SOI transistor region 402. Field control ring 406 is substantially similar in composition, width, and formation as field control ring 206 in FIG. 2 and field control ring 306 in FIG. 3. Field control ring 406 can provide similar advantages as field control ring 206 in FIG. 2 and field control ring 306.

Thus, as discussed above in embodiments of the invention in FIGS. 2, 3, and 4, by providing a field control ring to control conductivity of a surface portion of a bulk substrate underlying the field control ring, the invention's field control ring can increase the overall resistance of the bulk substrate. As a result, the invention's field control ring can surround one or more SOI transistors and advantageously minimize RF coupling through the bulk substrate by electrically isolating a conductive surface layer in the bulk substrate underlying the one or more SOI transistors.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, electrical isolation for SOI transistors has been described.

What is claimed is:

1. A method for reducing radio-frequency coupling of at least one semiconductor-on-insulator transistor through a bulk substrate of a semiconductor-on-insulator substrate, the method comprising:

forming or providing a field control ring of conductive material in a silicon layer over a buried oxide layer, the buried oxide layer having a thickness greater than a thickness of the silicon layer, the thickness of the buried oxide layer being between 0.4 micron and 1.0 micron, said field control ring having a width greater than the thickness of the buried oxide layer by a factor of between approximately 3.0 and approximately 10.0, the field control ring surrounding said at least one semiconductor-on-insulator transistor;

applying a bias voltage to the field control ring to provide an electrical charge to said field control ring; and generating an electrical field at a location underlying the field control ring to reduce a conductivity of a surface portion of said bulk substrate at said location underlying said field control ring to thereby reduce radio-frequency coupling of said at least one semiconductor-on-insulator transistor through said bulk substrate to ground.

2. The method of claim 1 wherein said applying the bias voltage includes applying a non-zero voltage to the field control ring.

3. The method of claim 1 further comprising doping the field control ring with a dopant having the same conductivity as the bulk substrate.

4. The method of claim 1 wherein said field control ring surrounds a plurality of semiconductor-on-insulator transistors.

5. The method of claim 4 further comprising coupling the plurality of semiconductor-on-insulator transistors in series.

6. The method of claim 4 wherein the plurality of semiconductor-on-insulator transistors form a radiofrequency switch.

7. A method for reducing radio-frequency coupling of at least one semiconductor-on-insulator transistor through a bulk substrate of a semiconductor-on-insulator substrate, the method comprising:

forming or providing a field control ring of conductive material in a silicon layer over a buried oxide layer, the buried oxide layer disposed over a proximal surface of the bulk substrate, a distal surface of the bulk substrate opposite the proximal surface being connected to ground, said field control ring having a width greater than a thickness of the buried oxide layer by a factor of between approximately 3.0 and approximately 10.0, the field control ring surrounding a plurality of semiconductor-on-insulator transistors coupled in series;

electrically charging said field control ring by applying a non-zero bias voltage to said field control ring; and generating an electrical field on the bulk substrate at a location underlying the field control ring to reduce a conductivity of a surface portion of said bulk substrate at said location underlying said field control ring to thereby reduce radiofrequency coupling of said plurality of semiconductor-on-insulator transistors through said bulk substrate to the ground.

8. The method of claim 7 wherein said electrically charging said field control ring includes implanting a dopant in said field control ring.

9. The method of claim 7 wherein the plurality of semiconductor-on-insulator transistors form a radiofrequency switch.

10. The method of claim 7 wherein said forming or providing the field control ring in the silicon layer includes an outer radial edge of the field control ring being adjacent an edge of the silicon layer.

11. A method for reducing radio-frequency coupling of at least one semiconductor-on-insulator transistor through a bulk substrate of a semiconductor-on-insulator substrate, the method comprising:

forming or providing a field control ring in a silicon layer of said semiconductor-on-insulator substrate, the silicon layer disposed over a buried oxide layer, the buried oxide layer disposed over a proximal surface of the bulk substrate, a distal surface of the bulk substrate opposite the proximal surface being connected to ground, said field control ring having a width greater than a thickness of the buried oxide layer by a factor of between approximately 3.0 and approximately 10.0, the field control ring surrounding said at least one semiconductor-on-insulator transistor;

electrically charging said field control ring; and reducing a conductivity of a surface portion of said bulk substrate underlying said field control ring to thereby reduce radiofrequency coupling of said at least one semiconductor-on-insulator transistor through said bulk substrate to the ground or to a semiconductor-on-insulator transistor situated outside of said field control ring.

12. The method of claim 11 wherein said electrically charging said field control ring includes implanting a dopant in said field control ring.

13. The method of claim 11 wherein said electrically charging said field control ring includes coupling a non-zero bias voltage to said field control ring.

14. The method of claim 11 wherein the thickness of the buried oxide layer is between 0.4 micron and 1.0 micron.

15. The method of claim 11 wherein the at least one silicon-on-insulator transistor is a plurality of semiconductor-on-insulator transistors coupled in series.

16. The method of claim 15 wherein the plurality of semiconductor-on-insulator transistors form a radiofrequency switch.

17. The method of claim 11 wherein said forming or providing the field control ring in the silicon layer includes an outer radial edge of the field control ring being adjacent an edge of the silicon layer.

18. The method of claim 11 wherein the thickness of the buried oxide layer is greater than a thickness of the silicon layer.

* * * * *